(12) United States Patent
Shaeffer

(10) Patent No.: US 6,946,921 B1
(45) Date of Patent: Sep. 20, 2005

(54) METHOD AND APPARATUS FOR PRODUCING HIGH-FREQUENCY OSCILLATIONS

(75) Inventor: Derek Shaeffer, Redwood City, CA (US)

(73) Assignee: Big Bear Networks, Inc., Milpitas, CA (US)

( * ) Notice: Subject to any disclaimer, the term of this patent is extended or adjusted under 35 U.S.C. 154(b) by 0 days.

(21) Appl. No.: 10/613,416

(22) Filed: Jul. 3, 2003

Related U.S. Application Data

(62) Division of application No. 10/041,234, filed on Jan. 7, 2002, now Pat. No. 6,700,452.

(51) Int. Cl.$^7$ ................................................ H03B 1/00
(52) U.S. Cl. .......................... 331/46; 331/50; 331/55; 331/56; 331/177
(58) Field of Search ........................ 331/177, 46, 50, 331/56, 55

(56) References Cited

U.S. PATENT DOCUMENTS

| | | | |
|---|---|---|---|
| 4,692,714 A * | 9/1987 | Galani | 331/56 |
| 5,699,021 A * | 12/1997 | Hill | 331/56 |
| 6,218,908 B1 * | 4/2001 | Oberhammer | 331/56 |
| 6,700,452 B1 * | 3/2004 | Shaeffer | 331/177 R |

FOREIGN PATENT DOCUMENTS

JP          62061407          * 3/1987

OTHER PUBLICATIONS

Kippenberg et al. "Ultra-low threshold optical nonlinear oscillator wing a high-Q microsphere" Summariers of papers presented at the Lasers and Electro-optics CLEO '02 Technical Digest May 19-24, 2002 vol. 1 p. 254.*

* cited by examiner

Primary Examiner—Michael B. Shingleton

(57) ABSTRACT

A method and apparatus for producing high-frequency oscillations is disclosed. A new resonator architecture minimizes via losses and supports a compact layout of active circuitry. The resonator architecture incorporates dual resonant transmission lines to reduce resonator loss and facilitate compact layout. The oscillations of two oscillators are cross-coupled in a way that compensates for the delay in the active devices of the oscillator, thus permitting accurate alignment of the active circuitry response with the oscillation waveform. The cross-coupling of the two oscillators improves phase noise performance and eliminates spurious oscillations. An active circuit architecture provides very narrow pulses for the operation of the oscillator. This architecture provides for accurate cross-coupling and pulsed-mode operation to improve manufacturing stability and phase noise performance.

15 Claims, 8 Drawing Sheets

METHOD AND APPARATUS FOR PRODUCING HIGH-FREQUENCY OSCILLATIONS

This is a division of application Ser. No. 10/041,234, filed Jan. 7, 2002, now U.S. Pat. No. 6,700,452.

BACKGROUND OF THE INVENTION

1. Field of the Invention

The invention relates to a method and apparatus for producing high-frequency oscillations. More specifically, the invention relates to a method and apparatus for producing such oscillations without the drawbacks of prior high-frequency oscillators.

2. Related Art

Almost every electronic instrument contains an oscillator or waveform generator of some type. Such devices as signal generators, function generators and pulse generators clearly require a source of regular oscillations. However, perhaps less obviously, any cyclical measuring instrument or other instrument that initiates measurements or processes or whose function involves periodic states or waveforms also requires such a source. Such devices may include networking equipment, wireless equipment, computers and other applications. In order to allow these devices to operate at higher and higher frequencies, the frequency of the waveform sources must increase as well.

It is desirable to use oscillators that maximize noise performance while operating with minimum power consumption, and that cost as little as possible (i.e., take up the least amount of die area). However, at very high frequencies, oscillators may suffer from a number of problems, including:

1. Resonator losses. Metalization and via losses may lead to increased power consumption for a given phase noise performance. For example, when using shorted microstrip transmission lines, a desirable approach at very high frequencies, such losses associated with the short become particularly troublesome and degrade the performance of the oscillator.
2. Layout difficulties. The layout of the oscillator circuit should be very compact at very high frequencies in order to minimize the influence of parasitic reactances on oscillator performance. Since the resonator is often much larger than the active circuitry, such a compact layout may be difficult to achieve, particularly when the two ports of a resonator are separated physically.
3. Noise cyclostationarity. Oscillators typically suffer from periodic moments of increased or decreased sensitivity to noise from external sources or from active devices in the oscillator circuit itself. It is highly desirable to refresh the energy stored in the resonator during such moments of decreased sensitivity in order to improve the performance of the oscillator with respect to phase noise and jitter. This approach requires accurate time-alignment of the active circuitry driving waveforms with oscillation voltages, which alignment becomes increasingly difficult as the frequency increases. Such an approach also requires a circuit architecture that is capable of generating the narrow current pulses that are applied to the resonator during the moments of reduced sensitivity.
4. Device delay. The unavoidable delay in active devices makes it difficult to optimally align the response of the active circuitry with the resonator waveforms. The resulting phase shift associated with this delay leads to an off-resonance oscillation and a corresponding reduction of the amplitude of the oscillation, and causes degraded phase noise performance. Device delay also reduces startup gain margin, possibly preventing startup entirely, and may also introduce unwanted parasitic oscillation modes.

In addition, it is often desirable to cross-couple oscillators to generate quadrature signals for timing purposes. One such example is shown in U.S. Pat. No. 6,188,292 (see, e.g., FIG. 3). However, this approach uses variable coupling after the non-linear elements of the oscillators so that the frequency of the output may be varied, and this results in high phase noise that is undesirable.

These problems are overcome, at least in part, by the present invention.

SUMMARY OF THE INVENTION

The present invention contains three innovations that represent improvements over the prior art. First is a new resonator architecture that minimizes via losses and supports a compact layout of active circuitry. The resonator architecture incorporates dual resonant transmission lines to reduce resonator loss and facilitate compact layout.

Second is a method for cross-coupling the oscillations of two oscillators in a way that compensates for the delay in the active devices of the oscillator, thus permitting accurate alignment of the active circuitry response with the oscillation waveform. The cross-coupling of the two oscillators improves phase noise performance and eliminates spurious oscillations.

Third is a specific active circuit architecture that provides very narrow pulses for the operation of the oscillator. This architecture provides for accurate cross-coupling and pulsed-mode operation to improve manufacturing stability and also improves phase noise performance.

DETAILED DESCRIPTION OF THE PREFERRED EMBODIMENT

Figure 1:
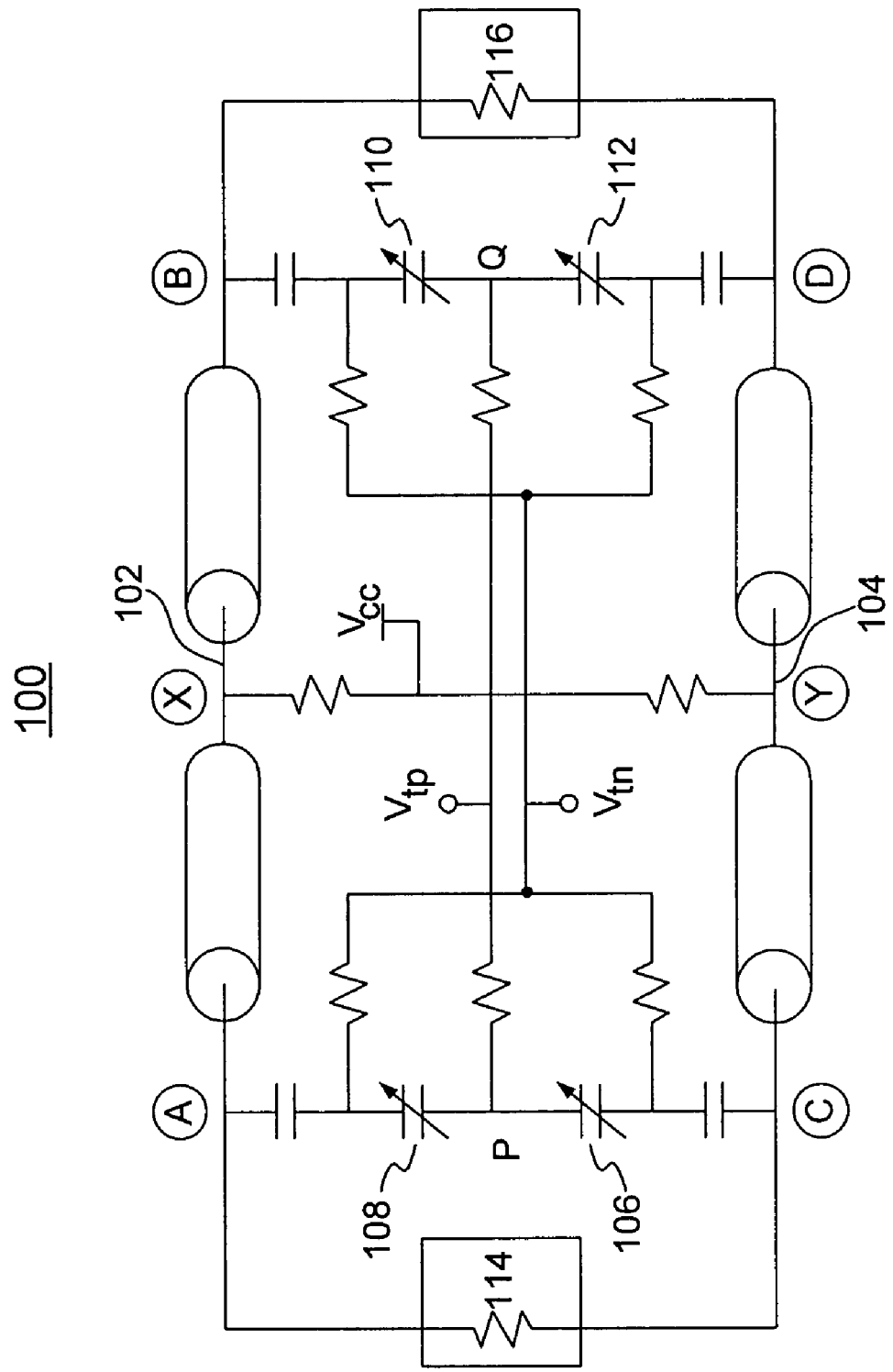
FIG. 1 is a diagram showing one embodiment of the resonator architecture of the present invention.

Referring now to FIG. 1, a first embodiment of the resonator architecture of the present invention is shown.

Resonator 100 contains two center-tapped transmission lines 102 and 104. These lines serve as resonant elements, with external tuning by variable capacitors 106, 108, 110 and 112. To keep modeling simple, and to make the layout as compact as possible, it is desirable to use straight transmission line segments. To achieve the effect of a shorted line without the associated via losses at the shorted end, a line is used that is twice the length of the shorted line that would normally be used, with the center taps ideally each located at a voltage null at the midpoint of the respective lines.

For example, when the resonator is in operation, nodes A and B on transmission line 102 in FIG. 1 operate out of phase so that node X, the point of symmetry in the middle of the line, sits at a voltage null, i.e. a "virtual" ground. As a result, connections to node X nominally conduct no signal current, and thus losses normally associated with such connections (such as via losses) do not impair the operation of the resonant line. Though conducting no signal currents, the center tap connection does provide a path for DC current to flow to the power supply ($V_{cc}$) from the active circuitry located at both ends of the transmission line. The frequency of the resonator may be changed by simply changing the length of the transmission lines.

The use of a straight transmission line causes the two ends of the line, nodes A and B, to be widely separated, which complicates layout of the active circuitry. To overcome this problem, a second transmission line 104 is introduced, running between nodes C and D, and is operated in such a way that nodes A and D are in phase with each other, and out of phase with respect to nodes B and C. Thus, transmission line 104 is operated in opposite phase to transmission line 102.

With the second transmission line 104 in operation, two sets of active circuitry 114 and 116 can be used, one at each end of the layout. Because transmission lines 102 and 104 can be placed very close to each other, the layout of the active circuits 114 and 116 may also be made very compact, thus minimizing parasitic reactances that would otherwise compromise high frequency operation.

When using this structure, it is important to eliminate undesirable oscillation modes that may be supported. Any oscillation mode may be decomposed into a superposition of four distinct modes, which are indicated in Table 1 below:

TABLE 1

|  | Node A | Node B | Node C | Node D |
| --- | --- | --- | --- | --- |
| Parasitic Mode $M_{oo}$ | ↑ | ↓ | ↓ | ↑ |
| Parasitic Mode $M_{eo}$ | ↑ | ↑ | ↓ | ↓ |
| Parasitic Mode $M_{oe}$ | ↑ | ↓ | ↑ | ↓ |
| Parasitic Mode $M_{ee}$ | ↑ | ↑ | ↑ | ↑ |

Since all other nodes can be compared to node A, we can say that node A will always be considered to be "in phase." From this definition, in Table 1 an upward arrow indicates operation in phase with node A, and a downward arrow indicates operation out of phase with node A (thus all arrows for node A are upward).

The desired mode is the primary mode described above, in which nodes A and D are in phase, and nodes B and C are out of phase. For convenience, we denote this mode, the first line of the table, as mode $M_{oo}$, representing the mode as "odd-odd." The first "odd" means that signals at opposite ends of transmission lines 102 (nodes A–B) and 104 (nodes C–D) are out-of-phase with each other, and the second means that the active circuitry blocks 114 and 116 operate in "odd" or "differential" mode such that the terminal signals of the active circuitry are out-of-phase with each other.

The $M_{oo}$ mode is the preferred oscillation mode because resistive elements in the resonator that couple to the resonator at points of symmetry (nodes X, Y, P and Q) do not conduct signal currents in this mode. Such elements include resistors at the center taps of the lines, and resistors at the center tap points of the tuning capacitors at either end of the lines. The remaining resistors couple to the top plates of the tuning capacitors to provide DC bias for those elements. Minimizing losses due to these resistors is accomplished by making their resistances high enough so that they can conduct only a small fraction of the signal current in the resonator.

All of the other modes shown in Table 1 are undesirable. In each of these "parasitic" modes, either the transmission lines 102 and 104, or the circuit blocks 114 and 116, or both operate in "even-mode" fashion where their terminal signals are in-phase. The resonator structure of the present invention eliminates potential oscillation in each of these unwanted modes.

In contrast to the $M_{oo}$ mode, the other modes cause the center-tapped resistive elements to conduct significant portions of the signal currents, and it is the damping action of these elements that eliminates oscillations in the unwanted modes. For example, in the $M_{eo}$ mode, nodes A and B operate in phase, and nodes C and D operate out of phase. In this case, the resistance on the $V_{cc}$ line conducts signal currents and damps potential oscillations. Similarly, in the $M_{oe}$ mode, nodes A and C operate in phase, and nodes B and D operate out of phase. Thus, resistance on the $V_{tp}$ line conducts signal currents and damps potential oscillations. Finally, in the $M_{ee}$ mode, all four nodes A, B, C and D operate in phase, bringing all of the resistances in the circuit into the signal path to dampen oscillations.

This discussion indicates that only the $M_{oo}$ mode is capable of sustained oscillations with low loss. Careful selection of the resistive elements of the resonator forces this mode to be enabled during startup, and all other modes to be suppressed. The resonator shown in FIG. 1 may be made with any acceptable active circuitry elements 114 and 116. These may be the of the type described below, or may be negative resistance cells as known in the prior art. Note that the center taps need not be exactly at the center point of the transmission lines, or at an exact voltage null for the oscillator to function. However, they should be at points where the voltage is substantially null, as any increase in potential at those points will result in some current flow and thus degraded performance.

A second part of the present invention provides a method for compensating for finite active device delay that might otherwise degrade the phase noise performance, reduce the startup gain margin, or introduce oscillation in undesired modes. As such delays are related to the active electronics in an oscillator rather than the type of resonator, the remedy according to the present invention is useful for many types of resonators, not simply the type disclosed in the foregoing paragraphs.

Figure 2:
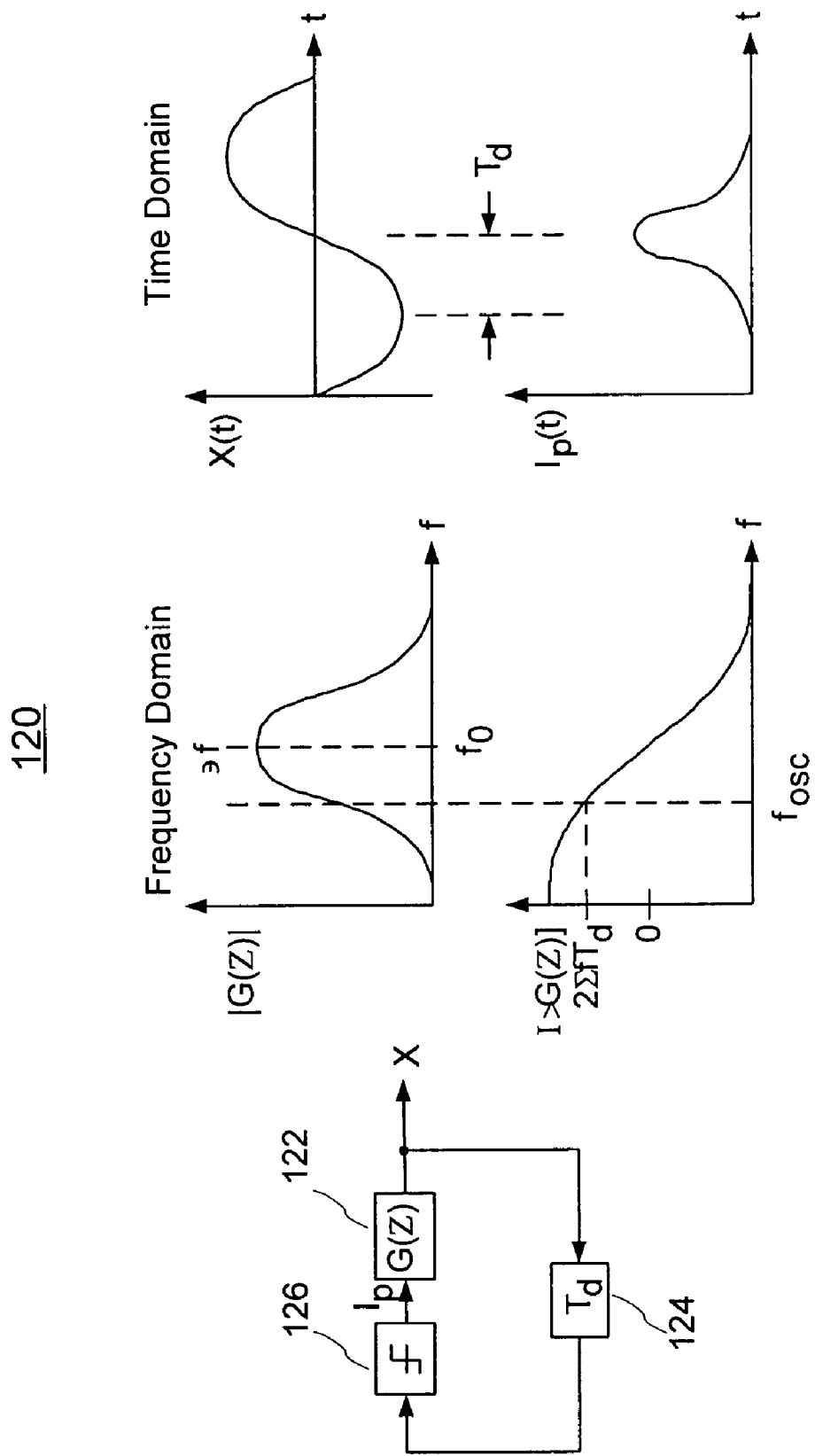
FIG. 2 illustrates the effect of device delay in a simplified oscillator loop.

FIG. 2 illustrates the effect of device delay in a simplified oscillator loop. Oscillator 120 is shown as a signal loop containing a frequency-selective gain element 122, a delay element 124, and a non-linear element 126. Together, delay element 124 and nonlinear element 126 represent an active device with inherent delay.

Sustained oscillations will only occur under conditions that lead to a phase shift which totals zero around the loop. Because the delay element 124 introduces a negative phase shift, the gain element 122 must compensate with a positive phase shift in order for this condition to be satisfied. This causes the oscillation frequency to shift away from the resonance frequency $f_o$, and toward a lower frequency $f_{osc}$.

This frequency shift away from resonance reduces the net gain around the loop, lowering the oscillation amplitude and degrading the signal to noise ratio of oscillator 120. Thus, there is increased jitter and phase noise in oscillator 120.

A related effect may be observed in the time domain behavior of oscillator 120. Ideally, the peak of the current pulse (for example, at the output of the nonlinear block as in a Colepitts oscillator) will be aligned with the maximum or minimum voltage of the oscillator. Where this occurs, the noise associated with the current pulse is at a maximum at the point where the oscillation waveform is least sensitive to noise injection. However, the delay in oscillator 120 causes the current waveform $I_p$ produced by the non-linearity to be misaligned with the oscillation voltage X by a time $T_d$. This misalignment further degrades the phase noise performance of the oscillator.

If the loop delay is too large, the oscillator may not start at all due to insufficient loop gain away from resonance. The unwanted delay may also make other undesired oscillation modes possible. For example, an oscillator that nominally operates in a differential mode may exhibit common-mode oscillations.

Compensating for loop delay requires a mechanism or device that provides positive phase shift to cancel the negative phase shift of the delay element. One way to accomplish this is to insert a non-minimum phase all-pass filter into the loop. However, the loading on the loop of such a filter may be prohibitively high, particularly at high frequencies, and the phase shift may not be well controlled over variations in manufacture.

Figure 3:
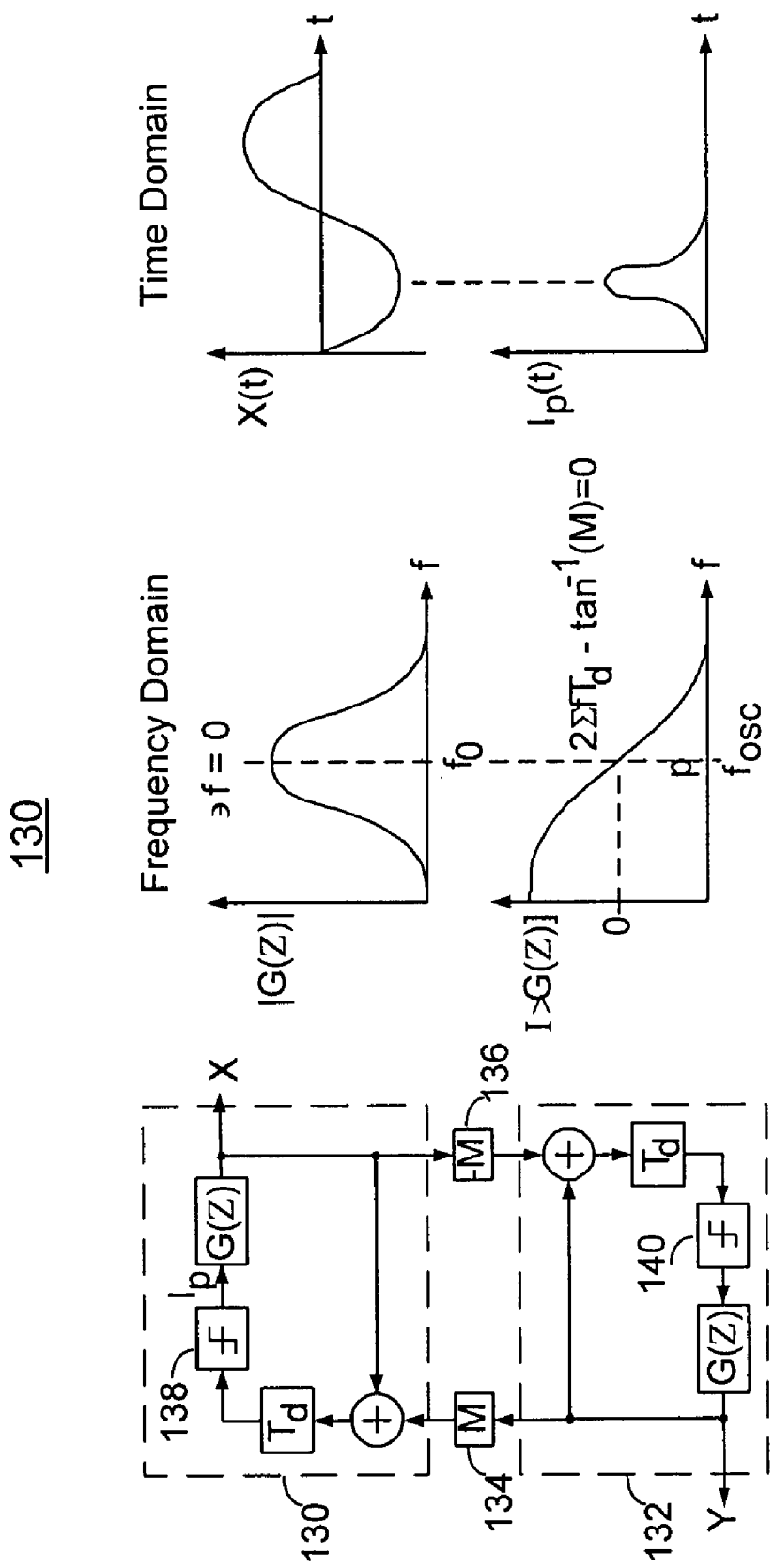
FIG. 3 is a diagram showing a pair of oscillators coupled together in one embodiment of the present invention.

An alternative approach in accordance with the present invention is to shift the phase of the oscillator signal by coupling the signal from a second, identical oscillator after the gain elements but before the non-linear elements. This technique is shown in FIG. 3. In this architecture, oscillators 130 and 132 are coupled together through coupling blocks 134 and 136. Under this condition, oscillations of oscillators 130 and 132 occur in quadrature; in particular, oscillator 132 leads oscillator 130. Thus, by adjusting the coupling coefficient M of coupling blocks 134 and 136, the delayed signal from oscillator 130 can be summed with an appropriately weighted signal from oscillator 132 so that the input to non-linear element 138 is advanced in phase and properly aligned with the oscillation waveform X (the waveform from oscillator 130).

For coupling in the opposite direction, because oscillator 130 lags oscillator 132, an inversion is necessary to achieve the same beneficial phase shift for the non-linear element 140 of oscillator 132. By carefully selecting the coupling coefficient M of coupling blocks 134 and 136, the loop delay can be canceled entirely, allowing both oscillators to run at resonance with proper time alignment of the current pulses with respect to the oscillation voltages.

The coupling can be performed anywhere in the loop between the output of the gain element and the input of the nonlinear element. However, maximum benefit is obtained if the signals from oscillators 130 and 132 are coupled in a manner that maintains their quadrature phase relationship in the summing process. For example, any path delays between the signals from oscillators 130 and 132 at a particular summation point should ideally be balanced.

It is also important that the signals from oscillators 130 and 132 be coupled after being filtered by the gain elements, but prior to the nonlinear blocks. Assuming that the gain blocks eliminate significant harmonics of the oscillator signals, summation prior to the nonlinear blocks results in a simple phase shift θ where:

$$\theta = \arctan(M) \text{ radians}$$

where M is the coupling coefficient. This would not necessarily be true if the two signals are coupled after the nonlinear blocks. For example, if the nonlinear blocks produce narrow pulses, then coupling the oscillator signals after the nonlinear blocks would broaden the pulse in addition to producing a phase shift. This broadening may degrade the phase noise performance and loop gain, and thus be undesirable.

A significant advantage of this technique is that the required coupling gain M can be obtained with high precision, even at very high frequencies. This is due to the fact that the gain, like other unitless quantities, can be made to track the ratio of electrical elements, rather than the absolute value of those elements. Thus, for example, the coupling gain M might be set by the ratio of two resistors or capacitors, or by the ratio of the gains of two active devices. Variations in the absolute component values will not produce significant deviations in the coupling gain M, as long as the ratio of the values is tightly controlled. This is easily done in practice, particularly in integrated circuit technologies, but matched components suited to this purpose are also available in discrete technologies.

Figure 4:
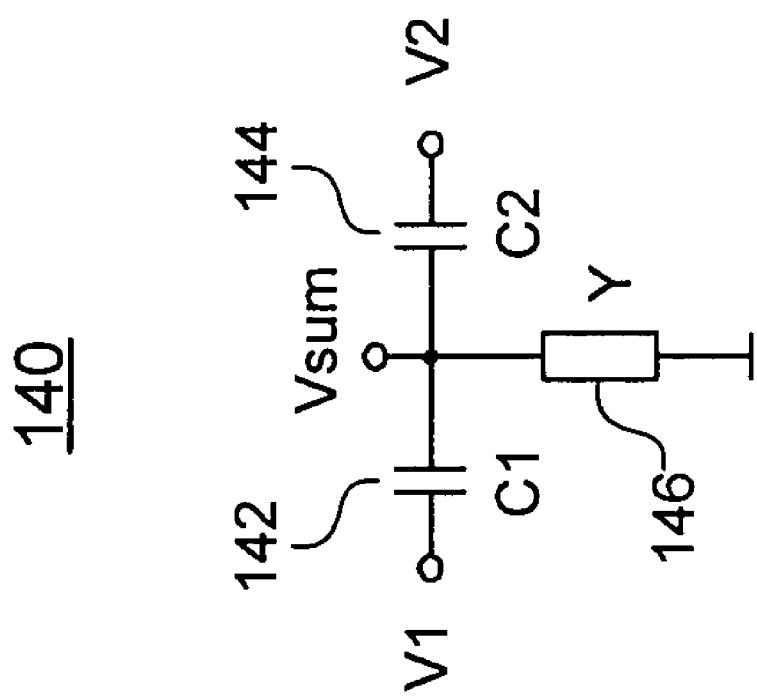
FIG. 4 is a diagram showing one embodiment of a coupling circuit that may be used with the embodiment of the present invention shown in FIG. 3.

Consider the coupling circuit 140 shown in FIG. 4, in which two voltages, V1 and V2, are applied to a capacitive summing network comprising two capacitors 142 and 144, having capacitances C1 and C2 respectively, and an element 146 with an unknown admittance Y. The output of the coupling circuit, $V_{sum}$, is nominally a weighted sum of the two input voltages. The unknown admittance Y may represent, for example, the admittance of an active device plus parasitic admittances that are significant at high frequencies, but that may not be well modeled or may exhibit significant variations in manufacturing.

Since a constant phase shift is desired, it would be ideal for the phase of the output to be independent of the admittance Y, and this is in fact the case. The total output voltage is given by:

$$V_{sum} = V1 \frac{C1}{C1 + C2 + Y/s} + V2 \frac{C2}{C1 + C2 + Y/s}$$

If V1 and V2 are in quadrature, with equal amplitudes, and V2 leading V1, then the phase shift θ is given by:

$$\theta = \arctan \frac{C2}{C1}$$

Thus, the phase of the output depends only upon the ratio of the two capacitances, and is independent of the admittance Y.

Figure 5:
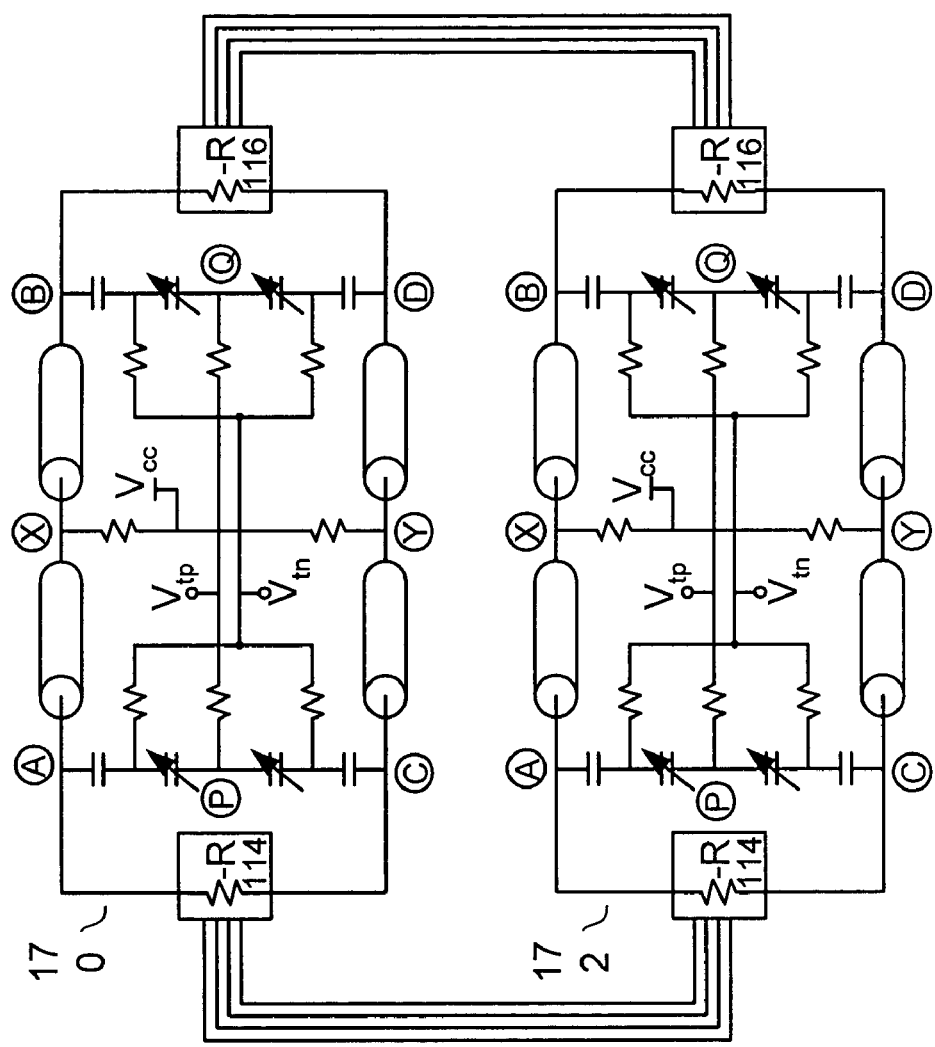
FIG. 5 is a diagram showing the cross-coupling between two oscillators of the type shown in FIG. 1 in one embodiment of the present invention.

FIG. 5 is a diagram of two oscillators 170 and 172, each of the type shown in FIG. 1, coupled together in this fashion. Due to the fact that oscillators 170 and 172 each incorporate two negative resistance cells, it is necessary to couple the oscillators together at both ends of the transmission lines.

Figure 6:
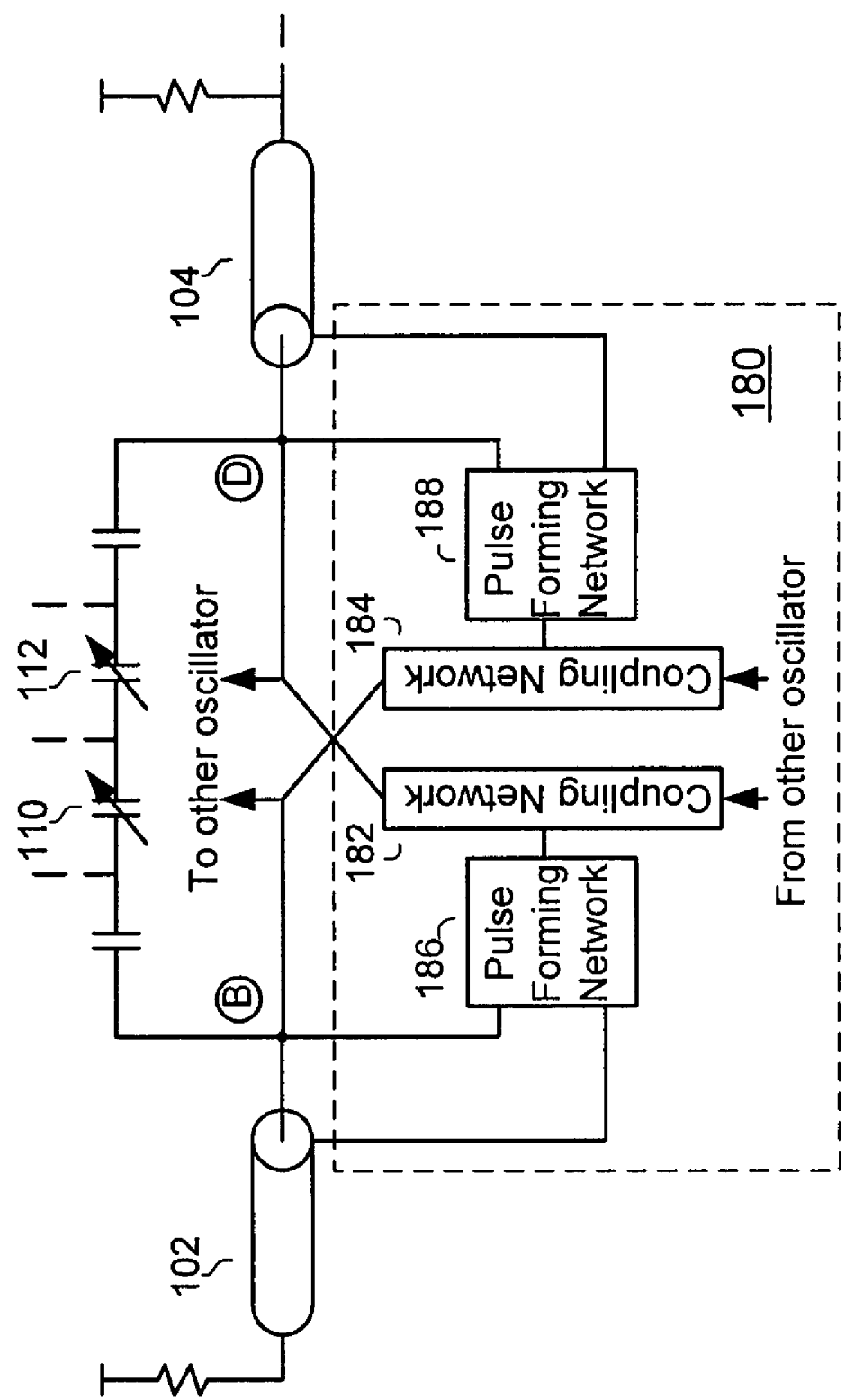
FIG. 6 is a diagram of a negative resistance amplifier architecture that may be used in the embodiment of the present invention shown in FIG. 1.

In addition to a coupling network to couple two oscillators together, it is advantageous to employ a negative resistance cell that produces narrow current pulses in response to the coupled signals to periodically refresh the energy stored in the resonator. As described in the foregoing discussion, these pulses should ideally be aligned with the maxima or minima of the resonator signals to minimize the effect of noise fluctuations associated with the current pulses. An example of a single-ended negative resistance cell that produces pulses with such alignment is known in the art as a Colepitts oscillator. The Colepitts architecture is unsuitable for the present invention due to its single-ended nature. What is required is an alternative architecture that lends itself to differential operation. An architecture for a negative resistance cell achieving these goals is illustrated in FIG. 6.

The architecture makes use of two coupling networks, 182 and 184, and two pulse forming networks, 186 and 188, to form a quasi-differential negative resistance cell, 180. A portion of resonator 100 from FIG. 1 is shown in FIG. 6 for reference, including transmission lines 102 and 104, variable capacitors 110 and 112, and nodes B and D. The coupling networks couple the resonator signals from the two coupled oscillators to the inputs of the pulse forming networks. The pulse forming networks produce narrow current pulses in response to their inputs, and these pulses appear at the outputs of the pulse forming networks in approximate alignment with the maxima or minima of the resonator signals. The current pulses are coupled back into the resonator to refresh the energy stored there. As a result of this last coupling, the output of pulse forming network 186 is connected to one input of the coupling network 184, which couples to the opposite pulse forming network, 188. Similarly, the output of pulse forming network 188 is connected to one input of the coupling network 182, which couples to the first pulse forming network, 186. This completes a positive feedback loop forming the desired negative resistance cell, 180.

The capacitive coupling networks shown in FIG. 4 may be used for coupling networks 182 and 184, but alternative coupling networks are also possible. By connecting two coupling networks and pulse forming networks back-to-back in this fashion, the negative resistance cell produces alternating pulses in a "ping-pong" fashion in response to the resonator voltage. This "ping-pong" action occurs because the input signals of the two pulse forming networks are out-of-phase in the desired oscillation mode and thus the pulse forming networks produce streams of pulses that are displaced from each other by half an oscillation cycle.

Figure 7:
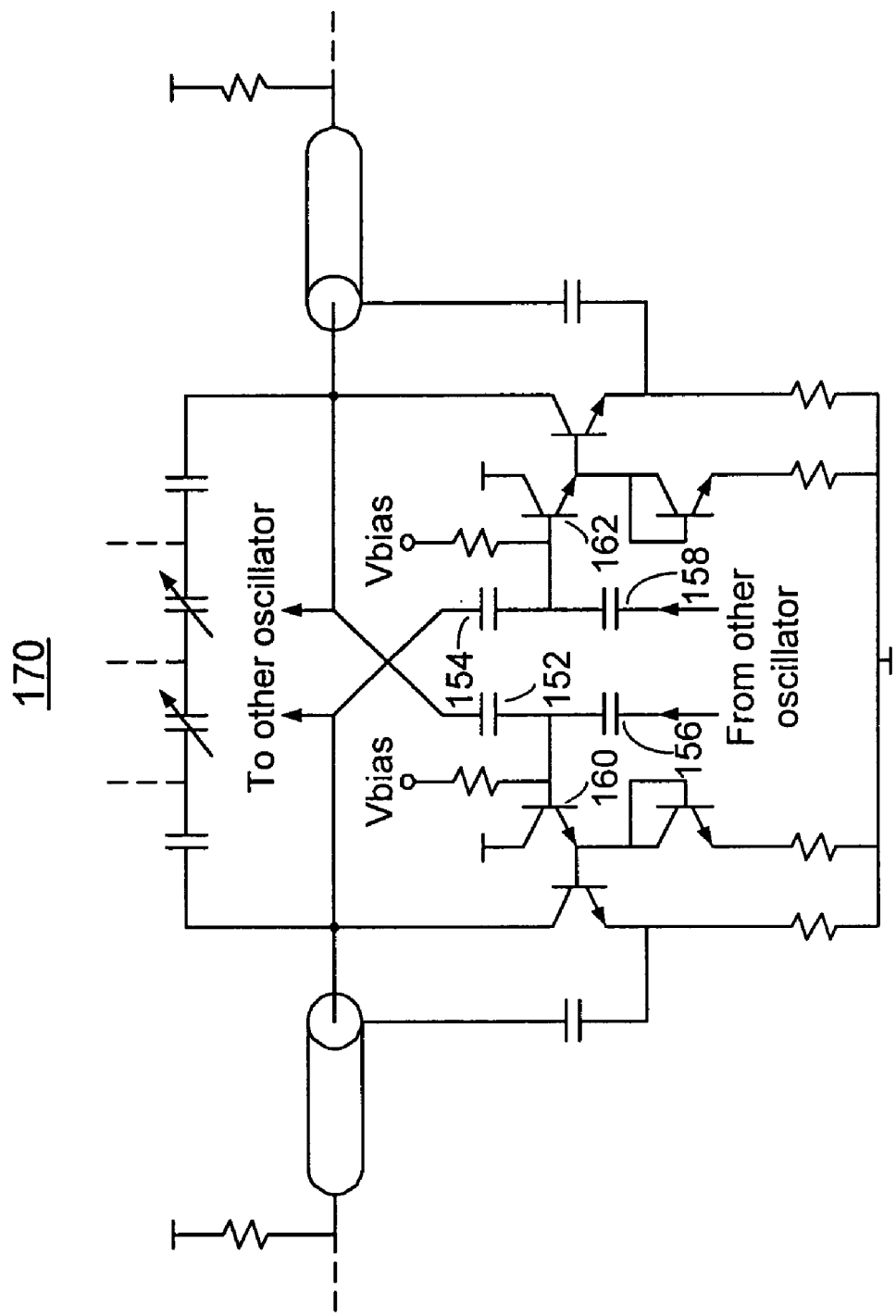
FIG. 7 is a diagram of a negative resistance amplifier that may be used in the embodiment of the present invention shown in FIG. 1.

An example of a circuit using this technique appears in FIG. 7. This circuit also incorporates the capacitive coupling network of FIG. 4. The unknown admittance Y shown in FIG. 4 is present implicitly in the input admittance of the pulse forming network in FIG. 7. Thus, FIG. 7 shows a simplified schematic of a negative resistance amplifier, 150, that can form one set of the active circuitry shown in the oscillator in FIG. 1. When used in conjunction with the resonator of FIG. 1, one such amplifier appears at each end of the resonator. A portion of resonator 100 from FIG. 1 is shown in FIG. 7 for reference, including transmission lines 102 and 104, variable capacitors 110 and 112, and nodes B and D.

Capacitors 152, 154, 156 and 158 form a capacitive summing network in accordance with the discussion of FIG. 4. Assuming that the signals of the two oscillators are in quadrature, the summed signal at the base of the first pair of transistors 160 and 162 exhibits a well-controlled phase shift that depends primarily on the ratio of the capacitor values, and that compensates for the delay through the other transistors which follow. Alternative embodiments that do not employ coupled oscillators and therefore do not require a summation network would omit some or all of these capacitors. Although the preferred embodiment makes use of capacitors in the summation network, other embodiments are also possible that make use of resistors or active devices to perform the summation, as will be evident to one skilled in the art.

The transistor networks respond to a sinusoidal input drive by producing narrow current pulses that are applied to the resonator. Thus, the transistors form the nonlinear element in the oscillator loop. The resonator filters these pulses, producing a sinusoidal voltage in response that is applied to the capacitive summing networks, thus completing the loop.

This approach differs from the prior art in that the two portions of the circuit operate independently in a "ping-pong" fashion, producing narrow current pulses that can be time-aligned with the minima of the resonator voltage waveform. As described above, this pulsed-mode operation results in reduced oscillator phase noise. In amplifier art, this may be described at class-AB, class-B or class-C operation, depending upon the conduction angle of the devices.

Conventional differential negative resistance amplifiers produce square wave rectified outputs, rather than narrow pulses, and are described in the art as class-A operation with the exception of the Colepitts oscillator, which also has a pulsed mode of operation. However, as mentioned in previous paragraphs, the Colepitts oscillator generally only appears in single-ended form, and not in the differential circuit of the present invention. Differential circuits are also desirable for their immunity to external noise sources and their lack of even-order distortion products, which produce duty-cycle distortion in an oscillator.

It should be noted, that the architecture of FIG. 6 and the associated circuit technique of FIG. 7 do not require the use of the resonator of FIG. 1, and other types of differential resonators may also be used. Furthermore, the architecture of FIG. 6 and the associated circuit technique of FIG. 7 do not require the use of coupled oscillators as disclosed in the foregoing paragraphs and may therefore be used in single oscillators, coupled oscillators according to the present invention, or with other coupling relationships between oscillators that are not contemplated in this invention.

Figure 8:
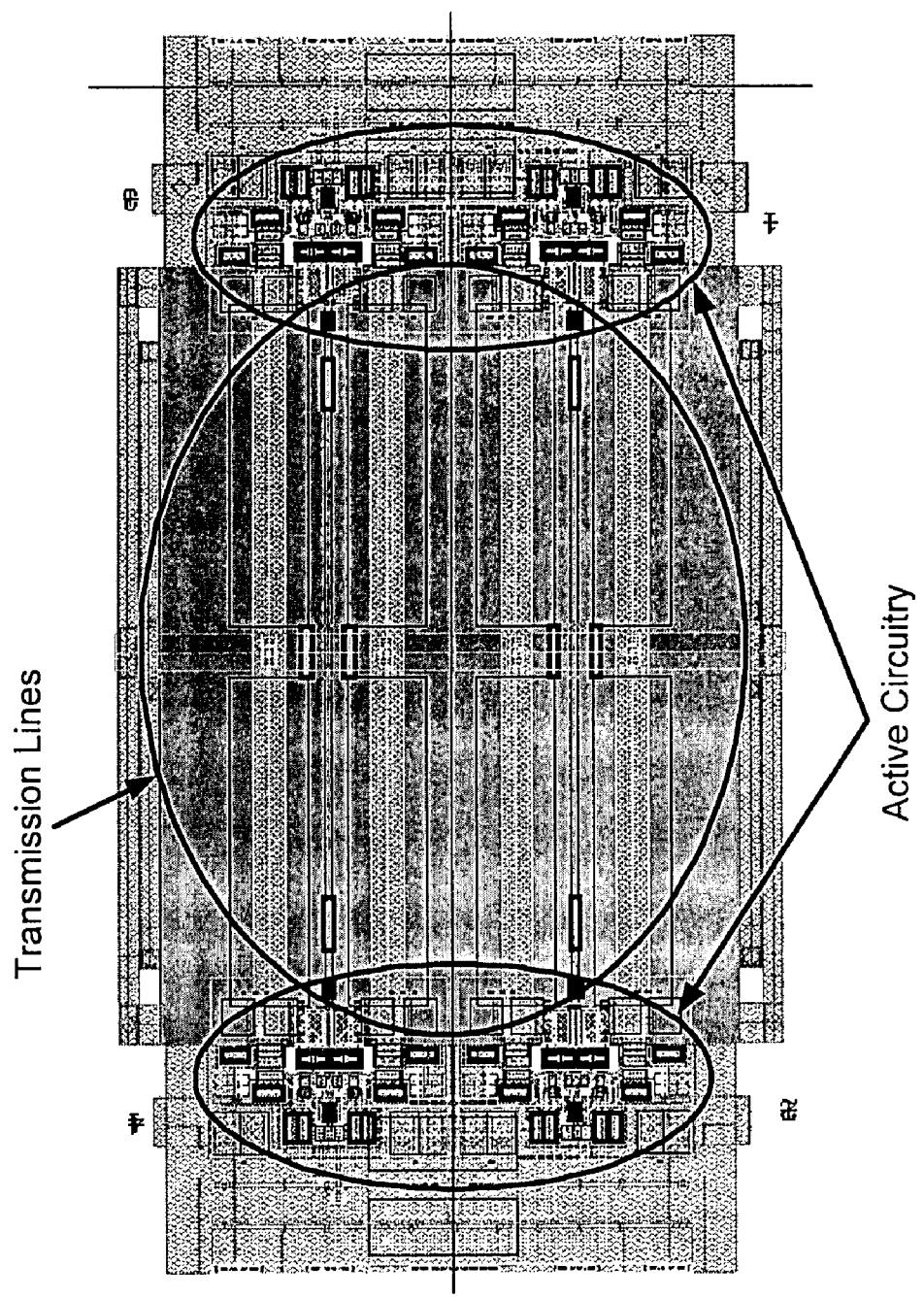
FIG. 8 is a diagram showing one embodiment of an oscillator according to the present invention.

An example of an oscillator that takes advantage of these concepts is shown in FIG. 8. In FIG. 8, four transmission lines, two for each oscillator, are shown in the middle of the figure. The active circuits are located at either end of the transmission lines, and the cross-coupling of the two oscillators is accomplished with routing channels at the extreme sides of the layout. As shown in FIG. 8, this architecture facilitates very tight layout of the active devices at the very edges of the transmission lines.

In the foregoing specification, the invention has been described with reference to specific embodiments thereof. It will, however, be evident that various modifications and changes can be made thereto without departing from the broader spirit and scope of the invention as set forth in the appended claims. For example, other configurations of active circuitry may be used, or other types of coupling circuits between the two oscillators. The specification and drawings are, accordingly, to be regarded in an illustrative rather than a restrictive sense. Therefore, the scope of the invention should be limited only by the appended claims.

What is claimed is:

1. An oscillator system for generating timing signals, comprising:
    a first oscillator containing gain and non-linear elements:
        said first oscillator comprising:
            a first center-tapped transmission line;
            a second center-tapped transmission line, operated out of phase with the first transmission line;

a first oscillating circuit connected to one end of the first transmission Line and one end of the second transmission line; and a second oscillating circuit connected to the opposite end of the first transmission line and the opposite end of the second transmission line;

a second oscillator containing gain and non-linear elements;

a first coupler for coupling a first signal from the first oscillator accessed at a point between the output of the gain element of the first oscillator and the input of the non-linear element of the first oscillator, to said second oscillator at a point between the output of the gain element of the second oscillator and the input of the non-linear element of the second oscillator; and a second coupler for coupling a second signal from the second oscillator accessed at a point between the output of the gain element of the second oscillator and the input of the non-linear element of the second oscillator, to said first oscillator at a point between the output of the gain element of the first oscillator and the input of the non-linear element of the first oscillator.

2. The oscillator system of claim 1 wherein the second oscillator further comprises:

a first center-tapped transmission line;

a second center-tapped transmission line, operated out of phase with the first transmission line;

a first oscillating circuit connected to one end of the first transmission line and one end of the second transmission line; and a second oscillating circuit connected to the opposite end of the first transmission line and the opposite end of the second transmission line.

3. The oscillator system of claim 1 wherein the first oscillating circuit further comprises a negative resistance amplifier.

4. The oscillator system of claim 3 wherein the second oscillating circuit further comprises a negative resistance amplifier.

5. The oscillator system of claim 1 wherein the first oscillating circuit comprises:

a first coupling network, whose input is coupled to the second transmission line;

a second coupling network, whose input is coupled to the first transmission line;

a first pulse-forming network, whose input is coupled to the first coupling network and whose output is coupled to the first transmission line; and a second pulse-forming network, whose input is coupled to the second coupling network and whose output is coupled to the second transmission line.

6. The oscillator system of claim 5 wherein the second oscillating circuit comprises:

a first coupling network, whose input is coupled to the second transmission line;

a second coupling network, whose input is coupled to the first transmission line;

a first pulse-forming network, whose input is coupled to the first coupling network and whose output is coupled to the first transmission line; and a second pulse-forming network, whose input is coupled to the second coupling network and whose output is coupled to the second transmission line.

7. The oscillator system of claim 1 wherein the first coupler further comprises a capacitive summing network.

8. The oscillator system of claim 1 wherein the first coupler further comprises a resistive summing network.

9. A method for generating high frequency oscillations, comprising:

producing first oscillations in a first oscillator containing first gain and non-linear elements wherein said producing first oscillations comprises:

operating a first center-tapped transmission line out of phase with a second transmission line;

providing a first oscillation signal connected to one end of the first transmission line and one end of the second transmission line; and providing a second oscillation signal connected to the opposite end of the first transmission line and the opposite end of the second transmission line;

producing second oscillations in a second oscillator containing second gain and non-linear elements;

producing a phase shift in the first oscillator by coupling the second oscillations, said second oscillations derived from a point between said second gain and said second non-linear elements, to said first oscillator at a point between the output of the gain element of the first oscillator and the input of the non-linear element of the first oscillator; and producing a phase shift in the second oscillator by coupling the first oscillations, said first oscillations derived from a point between said first gain and said first non-linear elements, to said second oscillator at a point between the output of the gain element of the second oscillator and the input of the non-linear element of the second oscillator.

10. The method of claim 9, further comprising:

tuning the first transmission line with a first plurality of capacitors; and tuning the second transmission line with a second plurality of capacitors.

11. The method of claim 10, wherein said tuning the first and second transmission lines further comprise tuning with variable capacitors.

12. The method of claim 9 wherein said providing the first oscillation signal further comprises obtaining the first oscillation signal from a negative resistance amplifier.

13. The method of claim 12 wherein said providing the second oscillation signal further comprises obtaining the second oscillation signal from a negative resistance amplifier.

14. The method of claim 9 wherein said providing the first oscillation signal further comprises:

coupling the first transmission line to a first pulse forming network; coupling the second transmission line to a second pulse forming network; coupling the output pulses from the first pulse forming network to the second transmission line;

coupling the output pulses from the second pulse forming network to the first transmission line.

15. The method of claim 14 wherein said providing the second oscillation signal further comprises:

coupling the first transmission line to a first pulse forming network;

coupling the second transmission line to a second pulse forming network;

coupling the output pulses from the first pulse forming network to the second transmission line;

coupling the output pulses from the second pulse forming network to the first transmission line.

* * * * *